(12) United States Patent
Dietrich

(10) Patent No.: US 7,405,981 B2
(45) Date of Patent: Jul. 29, 2008

(54) CIRCUIT FOR DATA BIT INVERSION

(75) Inventor: Stefan Dietrich, Türkenfeld (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/372,738

(22) Filed: Mar. 10, 2006

(65) Prior Publication Data

US 2006/0215473 A1   Sep. 28, 2006

(30) Foreign Application Priority Data

Mar. 11, 2005   (DE) .................... 10 2005 011 386

(51) Int. Cl.
*G11C 7/10* (2006.01)
(52) U.S. Cl. .............................. 365/189.05; 365/230.06
(58) Field of Classification Search .............. 340/146.2; 365/189.05
See application file for complete search history.

(56) References Cited

U.S. PATENT DOCUMENTS 6,243,779 B1   6/2001   Devanney et al.
6,671,212 B2   12/2003   Macri et al.
2006/0261929 A1*   11/2006   Hein ..................... 340/146.2

* cited by examiner

*Primary Examiner*—Huan Hoang
*Assistant Examiner*—Jason Lappas
(74) *Attorney, Agent, or Firm*—Maginot, Moore & Beck

(57) ABSTRACT

An electric circuit for inverting a data bit of a data burst read out from a memory module comprises a buffer for buffering a data burst being comprised of at least two data words, a decoder device comprised of at least two parallel-connected decoders, each comparing bitwise and simultaneously two neighbouring data words of the data words buffered in the buffer and generating an inversion flag, if the number of different data bits of the two neighbouring data words exceeds half the number of data bits of a data word, a correction device for generating a corrected inversion flag for a specific decoder of the decoders by inverting or not inverting the inversion flag of the specific decoder dependent on the inversion flag generated by the specific decoder and the inversion flags generated by the remaining of the decoders, and an inversion device comprised of a plurality of inverters, each inverting or not inverting a present of the data words of an associated of the decoders dependent on the corrected inversion flag of the associated decoder.

19 Claims, 13 Drawing Sheets

Reduction of the switching bits by DBI

FIG 10 2nd embodiment

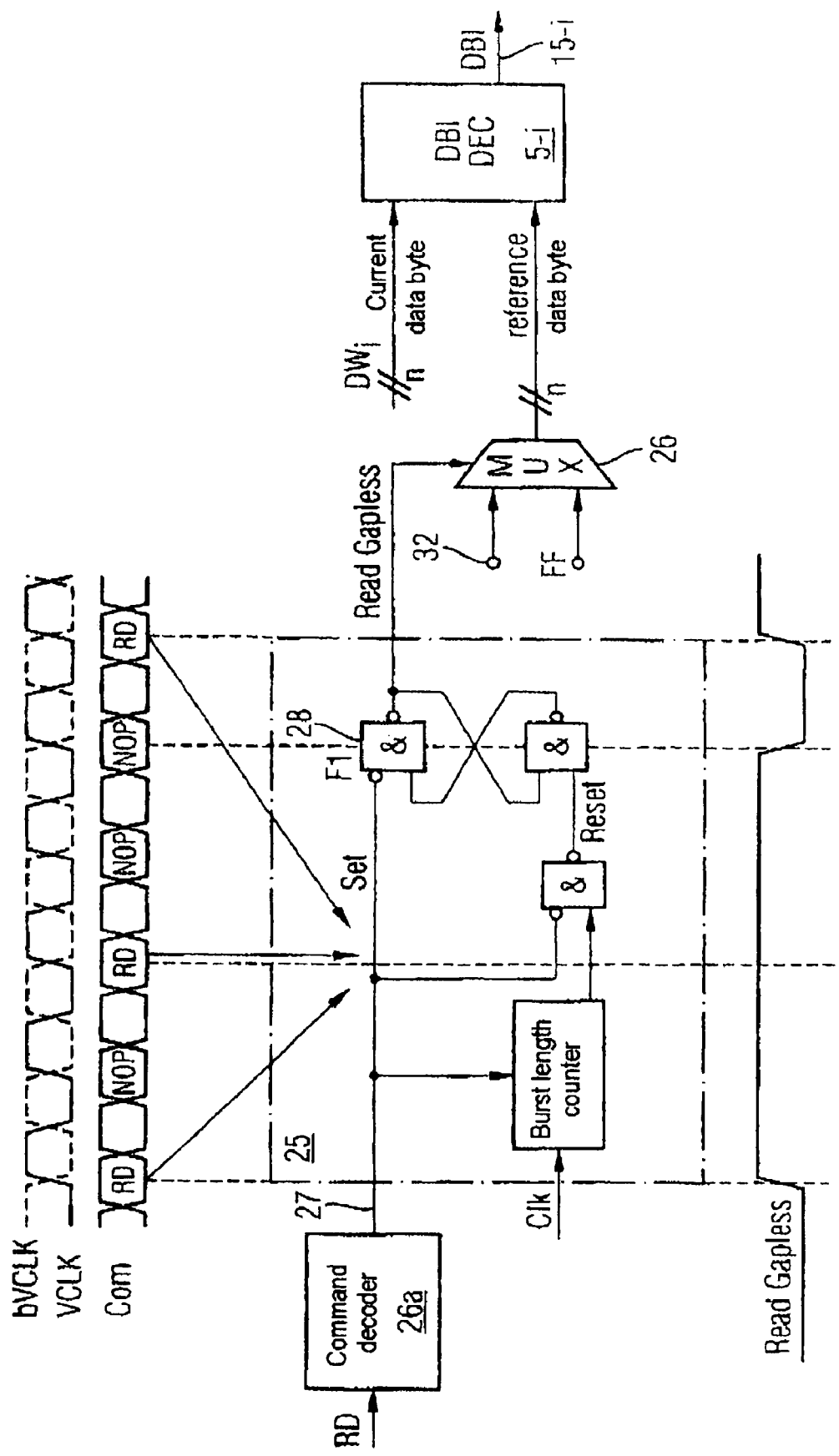

CIRCUIT FOR DATA BIT INVERSION

BACKGROUND OF THE INVENTION

1. Field of the Invention

The invention relates to a circuit unit for data bit inversion of a data burst read out from a memory module, in particular for DDR-SDRAM (Double Data Rate Synchronous Dynamic Random Access Memories).

2. Description of the Prior Art

FIG. 1 shows a computer system according to the prior art in which a memory chip and a controller chip exchange data via a common data bus. The increasing speed of computer processors and/or controllers requires a correspondingly higher speed in the case of instances of memory access and/or faster memory modules. The memory module and the processor are clocked via a clock signal CLK.

Various generations of RAM memories have been developed whose access rate has risen continuously. The time intervals in which new data read out from the memory cell array or to be written are present at the data inputs/outputs of the corresponding memory module have been shortening continuously. So-called DDR-SDRAMs with a double data rate have been developed starting from synchronous dynamic RAMs (SDRAMs). Such DDR-SDRAMs supply data twice as quickly as conventional SDRAMs. However, with DDR-SDRAMs there is no doubling of the clock pulse, but rather two actions are instigated in one clock pulse. Whereas conventional SDRAMs are always synchronized only relative to the rising clock-pulse edge of the bus clock pulse, in the case of a DDR-SDRAM both the rising and the falling clock-pulse edge are used for data transmission.

The data transfer rate of a DDR-SDRAM, which corresponds to double the clock frequency, is virtually 2 GHz for clock frequencies in the range from 800 MHz to 1 GHz.

Data are read out as a data burst when the memory module is accessed for reading, each data burst consisting of a number of data words which in each case comprise a predetermined number n of data bits. The number of the data bits within a data word corresponds to the bus width N of the data bus. 4 data words (m=4) each comprising 8 bits (n=8), for example, are read out in a data burst. FIG. 2 shows how a data burst is read out from an SDRAM according to the prior art. The inductive and capacitive couplings increase because of the increasing operating frequency, and so instances of data falsification occur. With increasing operating frequency, it becomes ever more difficult to transfer the data from the memory module to the controller. The noise on the data lines of the data bus constitutes one limitation here. The noise limits the validity period of the data and reduces the so-called data eye size. The more switching processes and/or data transfers that occur on the data lines, the greater the rise in the instances of data falsification, that is to say the bit error rate (BER) rises.

FIG. 3 shows the transfer of a data burst during a read access from a memory module to a controller in the case of a conventional data processing system according to the prior art. In the example illustrated in FIG. 3, a data burst with 8 data words each comprising 8 bits is transferred. After the memory module has received a read command (RD) from the controller, via a control bus, it transfers a data burst after a certain latency to the controller via the data bus. In the example illustrated, the memory module transfers the following sequence of data words, specifically: FF, 00, 00, EF, FF, 00, 02, FF. The number of bits occurring in this case, which change their value during a transition from a data word to the next data word, is specified in FIG. 3. All the bits of the data word change their logic value in the case of transition from the first data word (FF) to the second data word (00). In the case of the next transition, none of the bits changes its logic value. Seven bits change their logic value in the case of a transition from the data word 00 to the data word EF.

In order to limit the noise caused by this switching, a so-called data bit inversion (DBI) is introduced in the case of the GDDR4 (Graphics Data Double Rate) Standard. Here, before the transfer of the data a check is made internally in the memory chip with the aid of a decoder as to how many data bits of a data word have been changed relative to the data bits of the preceding data word transferred directly previously. If the number of the changed data bits exceeds half the data bits of the data word, all the data bits of the subsequent data word are transferred in an inverted fashion to the controller on the data bus. The inversion of the data bits of the data word is indicated to the controller by additional transfer of a DBI flag. FIG. 4 shows such a data bit inversion according to the prior art and for the example illustrated in FIG. 3.

Since more than half, specifically eight data bits, change the data state between the two first data words (FF, 00), the second data word is transferred in an inverted fashion as FF. Since likewise more than half the data bits change their state between the inverted data word FF and the next data word 00 to be transferred, the third data word is also transferred in an inverted fashion and as FF to the controller. Since only one data bit transition, and therefore less than half the number of the data bits, is inverted within a data word between the third inverted transferred data word and the next data word EF to be transferred, the fourth data word EF is transferred without inversion to the controller, etc . . . As may be learned from FIG. 4, the number of the data bit transfers or switching bits is substantially less than in the case of a data transfer without data bit inversion as illustrated in FIG. 3. FIG. 4 also shows the data bit inversion flag DBI, which is transferred in a parallel fashion and indicates to the processor whether the received data word has been inverted or not.

FIG. 5 shows a circuit unit for data bit inversion of a data burst, read out from a memory module, according to the prior art. The entire data burst read out from the memory cell array is firstly buffered in a burst buffer. For example, m=4 data words each having n=8 data bits are buffered in the burst buffer. An associated decoder, for example m=4 decoder, is provided for each data word DW within the burst buffer. Each decoder compares the data bits of a data word with those data bits of the preceding data word.

FIG. 6 shows a circuit design of a conventional decoder such as is used in the data bit inversion unit according to the prior art in accordance with FIG. 5. Upon reception of an enable signal (EN), the data word read out from the burst buffer is loaded into a register. At the same time, the preceding data word ($DW_{i-1}$) of the data burst is likewise loaded into a register as reference data word. An XOR logic circuit compares the data content of the two registers in a bitwise fashion. A counter counts the number of the different data bits. A comparator compares the number of the different data bits in the two data words with half the number of data bits within a data word. If, for example, the number of data bits within a data word is 8 bits, the comparator compares the number of different data bits that has been found with the value 4. If the number of the different data bits is higher than half the number n of data bits within the data word, a data bit inversion flag (DBI) is set by the comparator. The DBI flag controls a multiplexer of the decoder internally. The data word $DW_i$ buffered in the first register is switched through by the multiplexer either in an inverted or uninverted fashion. When the DBI flag is set by the comparator, this is followed by a bitwise inversion of the data bits. Once the comparator is finished with the comparison, it passes a ready indicator control signal on to the next decoder within the cascade.

As can be seen from FIG. 5, the data words which are output by the decoders are applied to a parallel-to-serial converter which is activated by the ready control signal from the last decoder within the cascade. The parallel-to-serial converter converts the received data words and the associated data bit inversion flags into a serial data stream. A data bus is used to output a data burst consisting of m data words, which each have a bit length n, and also m data bit inversion flags to the controller. As can be seen from FIG. 5, the decoders in the data bit inversion unit based on the prior art operate in serial fashion. The decoders are connected up as a cascade, that is to say a decoder i within the cascade always requires the output value from the preceding decoder i-1 within the cascade as reference data word in order to be able to make the necessary comparison. The parallel-to-serial converter P/S cannot start to convert the data words present in parallel form into a serial sequence until after the last decoder $DEC_m$ within the cascade has finished the comparison and activates it by means of an enable signal. The waiting time is thus m times the necessary decoding time for a decoder i within the cascade:

$$T_{wait} = m \cdot T_{DEC}$$

If the decoding time for a decoder $DEC_i$ within the cascade is one nanosecond, for example, and if a data burst comprises m=4 data words, the waiting time is 4 ns.

The increased waiting time results in an unwanted delay and the memory access time for data within the memory module. This has an overall negative effect on the system performance. The serial processing during the DBI assessment results in a long time delay for the parallel data transfer, since it is necessary to wait until the decoding of the last data word within the data burst has ended. All the data which have already been processed have to wait for this time until they can be processed further in parallel.

SUMMARY OF THE INVENTION

It is an object of the present invention to provide a circuit unit for data bit inversion of a data burst read out from a memory module in the case of which the waiting time and thus the memory access time are minimal.

The object is achieved in accordance with the invention by means of a circuit unit for data bit inversion of a data burst read out from a memory module, comprising:

(a) a buffer for buffering the data burst consisting of a number of data words, each data word comprising a specific number of data bits;

(b) a decoder unit which consists of a number of parallel-connected decoders, each of the m decoders respectively comparing in bitwise fashion an associated present data word of the buffered data burst with a neighbouring data word of the buffered data burst, which forms a reference data word, and generating an inversion flag when the number of the different data bits of the two neighbouring data words is more than half the number of data bits within a data word;

(c) a correction unit which corrects each inversion flag generated by a decoder as a function of the inversion flags which are generated by all the remaining decoders in order to generate a corrected inversion flag of the decoder; and having (d) an inversion unit which consists of a number of inverters, which respectively outputs the present data word of an associated decoder in an inverted or uninverted fashion as a function of the corrected inversion flag of the decoder.

A parallel-to-serial converter may be provided which converts the data words output by the inversion unit and the associated corrected inversion flags in a parallel-to-serial fashion and outputs them from the memory module as a data burst. The inverters of the inversion unit may be comprised of XOR gates. Each decoder of the decoder unit may have a logic circuit which compares the data word present at the decoder with the reference data word in a bitwise fashion. The logic circuit of the decoder may be comprised of XOR gates. Each decoder of the decoder unit may have a counter which determines the number of the different data bits of the data word present at the decoder and of the reference data word.

Each decoder of the decoder unit may have a comparator which compares the number of data bits determined by the counter with half the number of data bits within a data word. The comparator of the decoder may generate a logically high inversion flag when the number determined by the counter is more than half the number of data bits within a data word.

The correction unit may form a separate circuit unit which is connected downstream of the decoder unit. The correction unit may be integrated in the decoder unit.

The integrated correction unit may be comprised of a number of correction circuits, each correction circuit being included in an associated decoder of the decoder unit.

The correction circuit of a decoder may be formed by a logic circuit which corrects the inversion flag generated by the comparator of the decoder as a function of the inversion flags which are generated by the comparators of all the remaining m-1 decoders in order to generate a corrected inversion flag of the decoder.

The integrated correction unit may be formed by a memory from which a corrected inversion flag of the decoder is read out as a function of the inversion flag which is generated by the comparator of the decoder, and as a function of all the inversion flags which are generated by the comparators of the remaining m-1 decoders. The corrected inversion flag may drive a multiplexer of the decoder which outputs data applied to the decoder in a direct or inverted fashion.

Each data burst may comprise four data words. Each data word may comprise eight bits.

In a restricted version of the inventive circuit unit, each decoder of the decoder unit has an associated gap detection unit which ascertains whether the reference data word forms a part of a gap between two data bursts in order to generate a control signal for a multiplexer.

In a further restricted version of the inventive circuit unit, when the reference data word forms a part of a gap between two data bursts, the gap detection unit drives the multiplexer in such a way that a predetermined data word is switched through for the purpose of bitwise comparison with the data word present at the decoder, with, when the reference data word does not form a part of a gap between two data bursts, the gap detection unit driving the multiplexer in such a way that the reference data word is switched through for the purpose of bitwise comparison with the data word present at the decoder.

In another restricted version of the inventive circuit unit, two separate decoders are connected downstream of the multiplexer which is driven by the control signal generated by the gap detection unit, a first decoder comparing the present data word with the reference data word in bitwise fashion in order to generate a first inversion flag, a second decoder comparing the present data word with a predetermined data word in order to generate a second inversion flag, and the multiplexer switching the first inversion flag and the second inversion flag through to the correction unit as a function of a control signal.

DESCRIPTION OF THE DRAWINGS

FIG. 14 is a preferred embodiment of a gap detection unit used within the circuit unit according to the invention.

DESCRIPTION OF THE PREFERRED EMBODIMENTS

Figure 1:
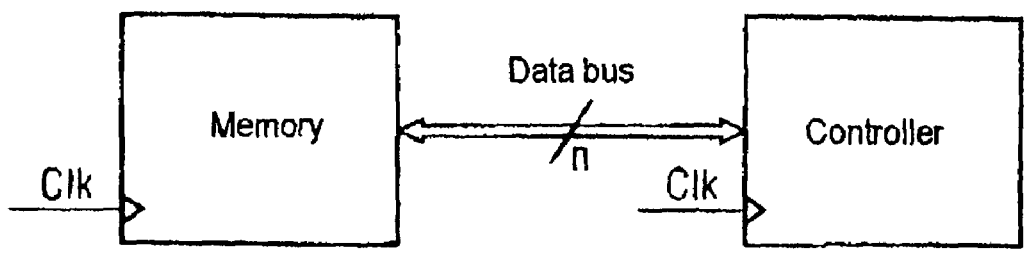
FIG. 1, as discussed above, is a circuit arrangement according to the prior art.
Figure 2:
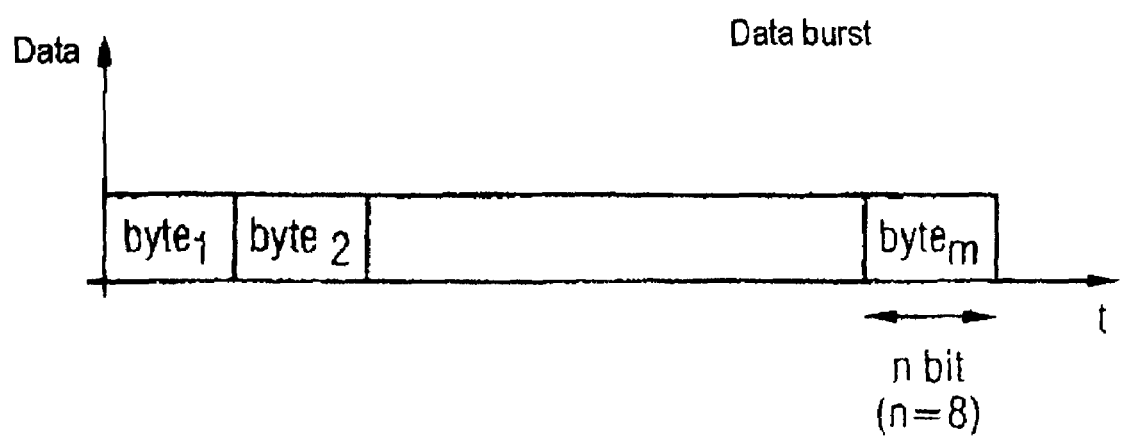
FIG. 2, as discussed above, is the design of a data burst according to the prior art.
Figure 3:
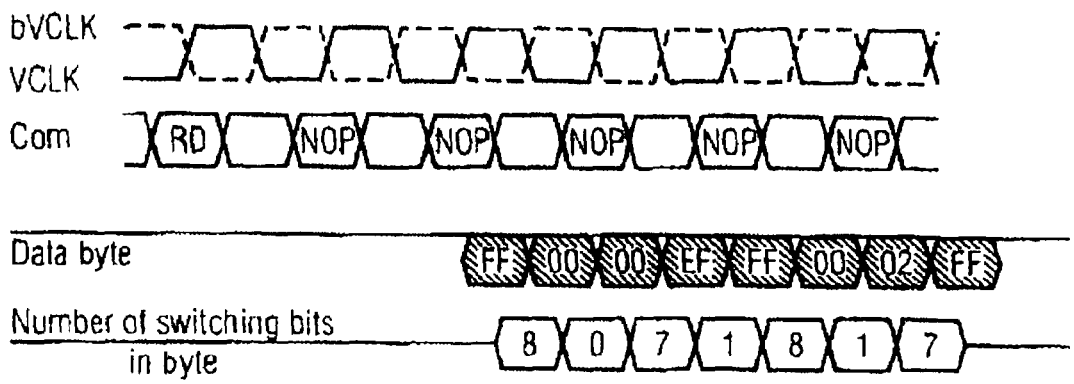
FIG. 3, as discussed above, is the reading of a data burst from a DRAM without data bit inversion according to the prior art.
Figure 4:
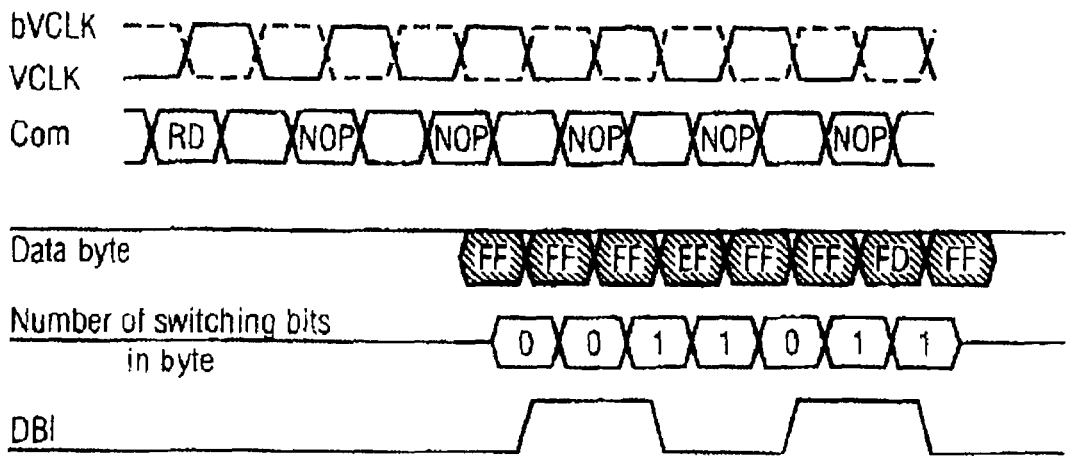
FIG. 4, as discussed above, is the reading of a data burst from a DRAM with data bit inversion according to the prior art.
Figure 5:
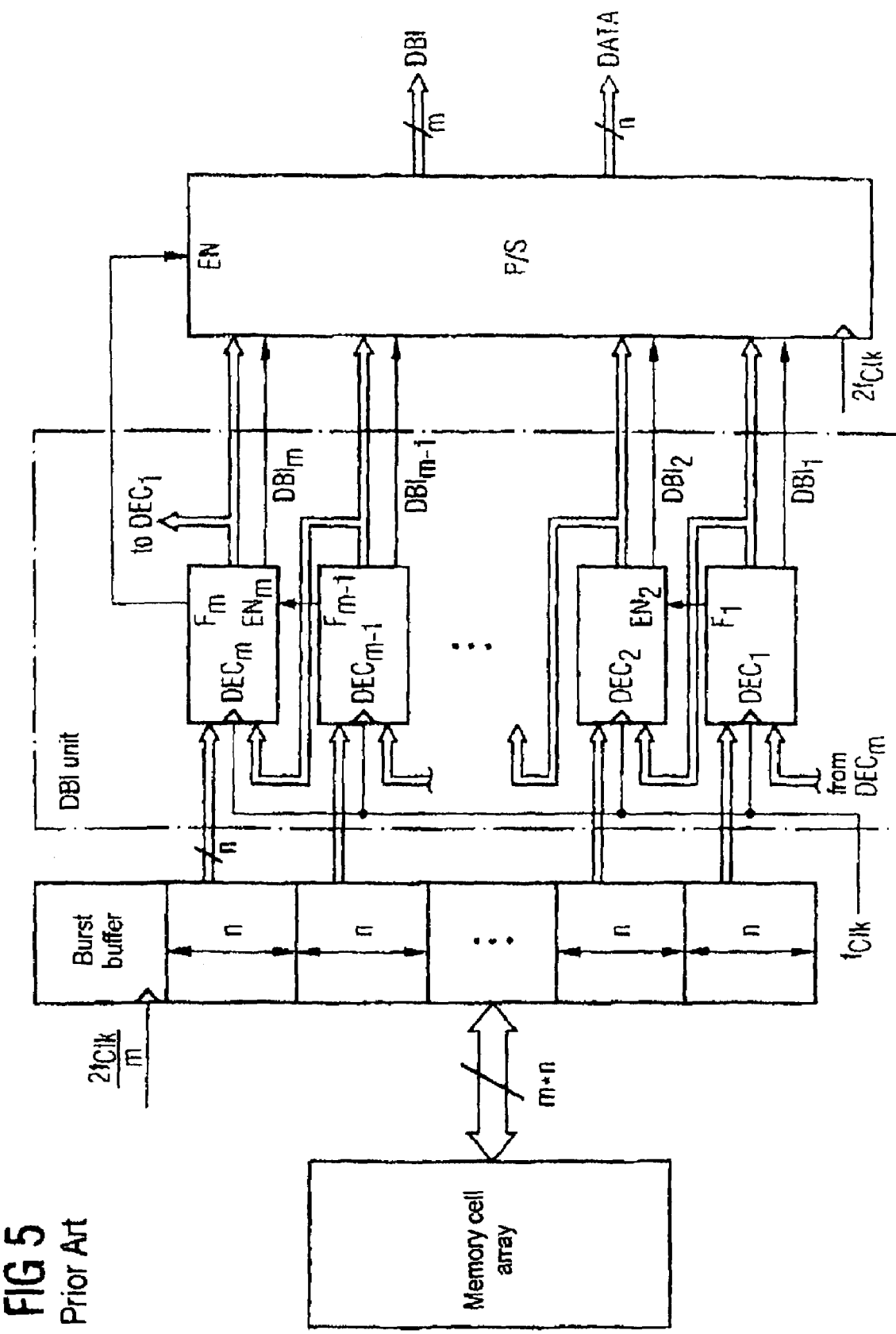
FIG. 5, as discussed above, is a circuit unit for data bit inversion of a data burst which has been read from a memory module, according to the prior art.
Figure 6:
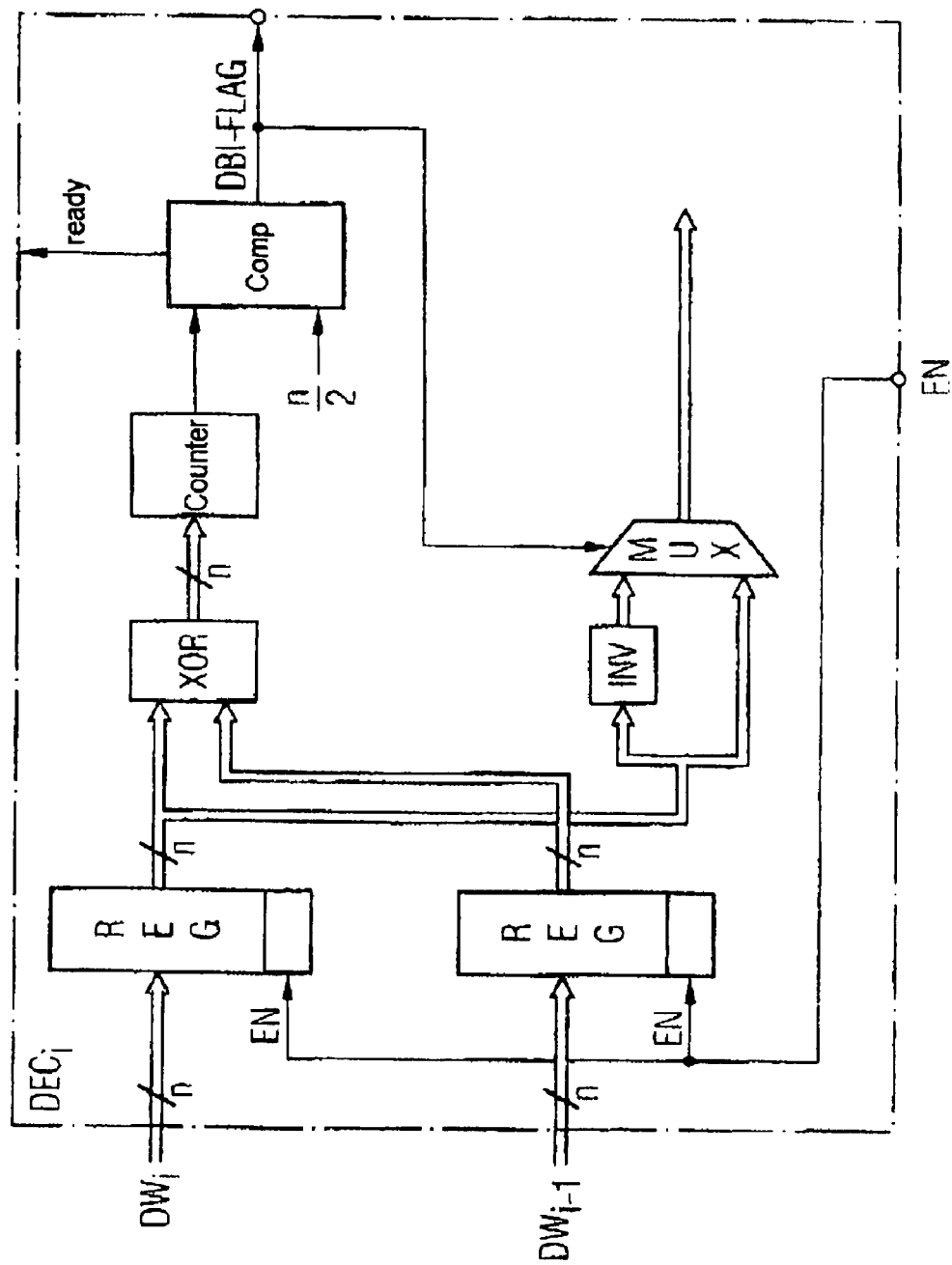
FIG. 6, as discussed above, is a block diagram of a decoder within the conventional circuit unit for data bit inversion according to the prior art, as illustrated in FIG. 5.
Figure 7:
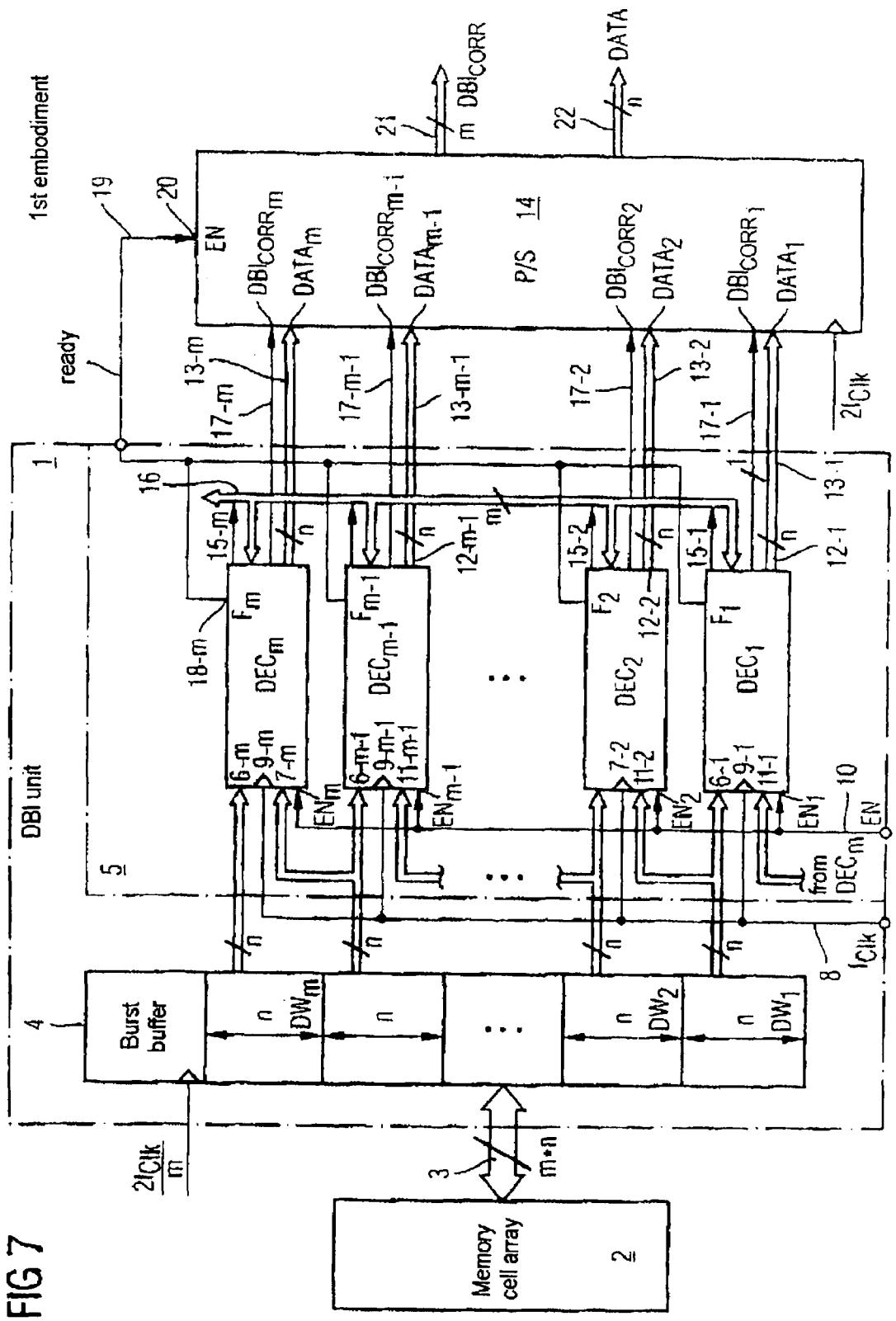
FIG. 7 is a first embodiment of the circuit unit for data bit inversion.

FIG. 7 illustrates a first embodiment of the circuit unit 1 according to the invention for data bit inversion of a data burst which has been read from a memory module. The circuit unit 1 according to the invention is integrated within the memory module and forms part of the read signal path. The memory module contains a memory cell array 2 having a multiplicity of memory cells for storing data bits. An internal data bus 3 is used to buffer all the data bits of a data burst which is to be read in a burst buffer 4 of the circuit unit 1. If the data burst consists of m data words each containing n data bits, m·n data bits are simultaneously written to the burst buffer 4.

The circuit unit 1 contains a decoder unit 5 which consists of a number of decoders 5-$i$ connected up in parallel. For each data word DW$_i$, an associated decoder 5-$i$ is provided within the decoder unit 5. Each decoder 5-$i$ respectively compares the associated data word DW$_i$, present at it, of the buffered data burst DB with an adjacent data word DW$_{i-1}$ of the buffered data burst DB in a bitwise fashion. Present at a first data input 6-$i$ of the decoder 5-$i$ is the associated data word DW$_i$ of the buffered data burst DB. Present respectively at a second data input 7-$i$ of the decoder 5-$i$ is the adjacent data word of the buffered data burst DB as reference data word. Each decoder 5-$i$ compares the data word, present at the first data input 6-$i$, of the buffered data burst DB with the adjacent data word, present at the second data input 7-$i$, in a bitwise fashion and produces an inversion flag DBI$_i$ if the number of different data bits in the two adjacent data words is more than half the number n of data bits within a data word. As can be seen from FIG. 7, the decoders within the decoder unit are connected up in parallel and are clocked in sync via a common clock line 8. Each decoder 5-$i$ has a clock input 9-$i$. The parallel-connected decoders 5-$i$ of the decoder unit 5 are activated by a common activation signal (Enable) via a control line 10. Each decoder contains an enable control input 11.

In the first embodiment illustrated in FIG. 7, each decoder has a data output 12 for outputting the present data word DW$_i$ in an inverted or uninverted fashion. The inverted or uninverted data words which are output by the decoders 5-$i$ are output to a downstream parallel-to-serial converter 14 via an internal data bus 13-$i$. Here, each decoder 5-$i$ in the case of the first embodiment of the circuit unit according to the invention illustrated in FIG. 7 generates a data bit inversion flag which is likewise output to the parallel-to-serial converter 14 via an output line 15. The data bit inversion flags DBI which are output by the decoders 5-$i$ are applied to all the other decoders 5-$i$ within the decoder unit 5 via an internal bus 16. In the first embodiment illustrated in FIG. 7, an integrated correction unit provided within the decoders 5-$i$ takes the inversion flags DBI$_i$ produced by all the other decoders as the basis for producing a respective corrected inversion flag (DBI$_{CORR1}$) in each decoder, said corrected inversion flag being output to the parallel-to-serial converter 14 via a data line 17-$i$. As soon as a decoder 5-$i$ is finished with the decoding, it indicates this at a control output 18-$i$. The indicator outputs of the decoders 5-$i$ are connected to an activation input (Enable) 20 of the parallel-to-serial converter 14 via a common control line 19. As soon as all the decoders 5-$i$ in the circuit unit 1 are finished with the decoding, the parallel-to-serial converter 14 starts the conversion. The parallel-to-serial converter 14 converts the data words DW received from the decoder units and the associated corrected inversion flags DBI from parallel to serial and outputs them as a data burst DB from the memory module. The corrected inversion flags DBI$_{CORR}$ are read via an m-bit data bus 21 and the data words are read via an n-bit data bus 22. In this way, the data burst DB is transmitted serially to the controller.

In line with the invention, the data words DW of a data burst DB which are buffered in the burst buffer 4 are assessed by the decoder unit 5 in parallel for all the available data bits at the same time. As soon as the decoders 5-$i$ of the decoder unit 5 have received the activation signal via the control line 10, they start the decoding operation. The reference data word used is the adjacent data word DW$_{i-1}$ present at the second data input 7-$i$. Since the decoders 5-$i$ have no information at this time about whether or not the data value used as reference data word needs to be inverted, a correction unit performs appropriate recorrection. As soon as the decoding by the decoders 5-$i$ has concluded, the control line 19 is used to activate the parallel-to-serial converter 14, which outputs the data words DW output by the decoder unit 5 and the corrected data bit inversion flags.

Since the decoders 5-$i$ in the decoder unit 5 all operate simultaneously in parallel, the waiting time is made up of the processing time of a decoder and of the time which is required for the recorrection:

$$T_{WAIT} = T_{EC} + T_{CORR} < m \cdot T_{DEC}$$

If a data burst consists of m=4 data words and if the decoding time in a decoder 5-$i$ is 1 ns, for example, then the waiting time of a conventional circuit unit for data bit inversion is 4·1 ns, whereas in the inventive circuit unit 1 for data bit inversion the waiting time is just 1 ns plus the time which is required for the recorrection. Since the time required for the recorrection is very short and typically below 1 ns, the waiting time in the inventive circuit unit for data bit inversion is less than 2 ns and thus less than half the decoding time which is required in a conventional circuit unit for data bit inversion. The reduced waiting time $T_{WAIT}$ for decoding means that the memory access time in a memory module which contains the inventive circuit unit for data bit inversion is significantly reduced.

Figure 8:
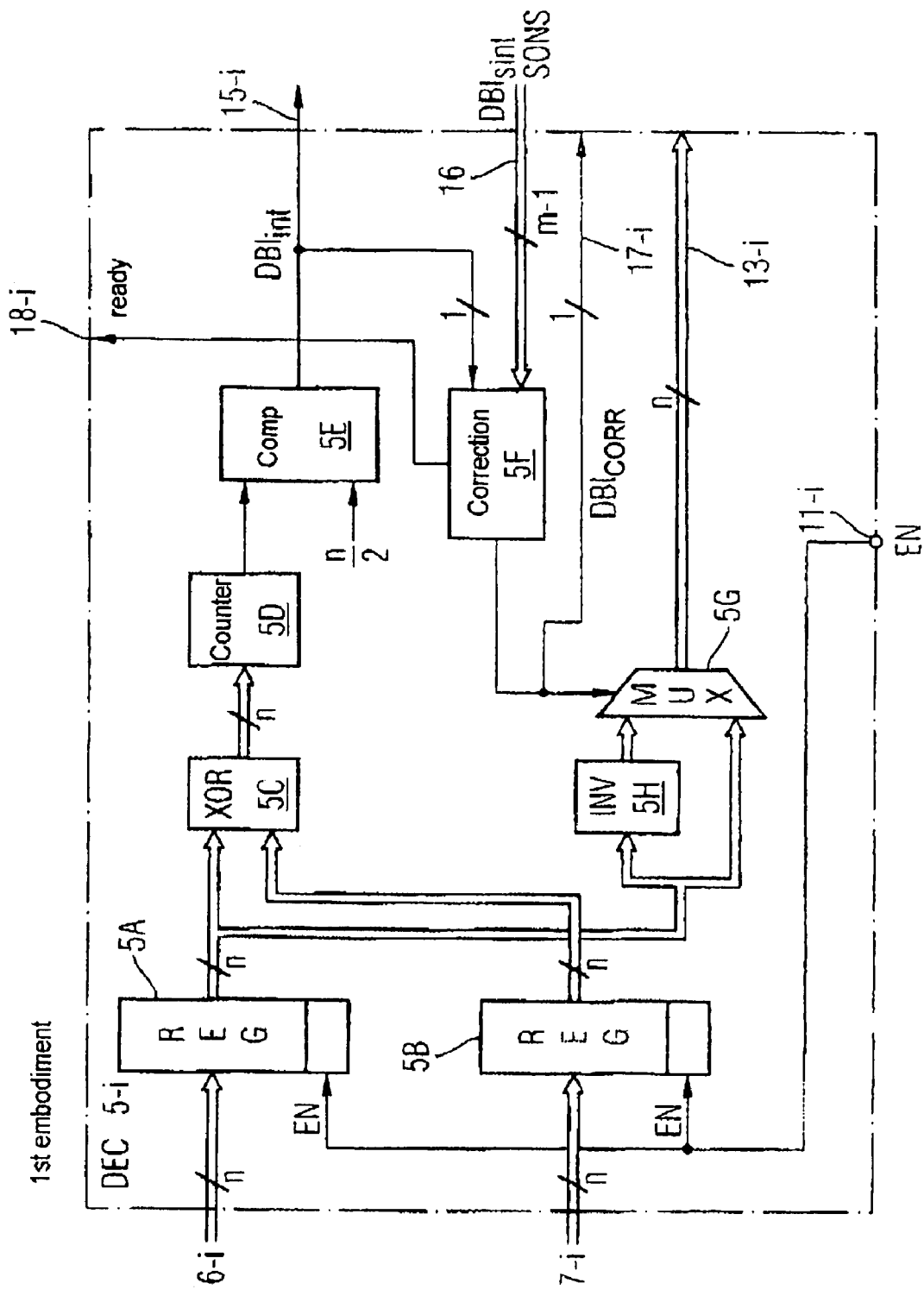
FIG. 8 is a block diagram of a decoder within the circuit unit of FIG. 7.

FIG. 8 shows the circuit design of a decoder 5-$i$ within the decoder unit 5 in accordance with the first embodiment of the invention, as illustrated in FIG. 7. The decoder 5-$i$ contains a first register 5A for buffering the data word $DW_i$ present at the first data signal input 6-$i$, which data word is read from the burst buffer 4. In addition, the decoder 5-$i$ contains a second register 5B, which buffers the reference data word present at the second data input 7-$i$, which reference data word is formed by the adjacent data word. The two registers 5A, 5B are activated via an internal control line on the basis of the activation control signal (Enable) in order to buffer the present data. The decoder 5-$i$ also contains a logic circuit 5C, which compares the data bits buffered in the two registers 5A, 5B with one another in bitwise fashion. The logic circuit 5C preferably has n XOR gates which in each case compare a data bit of the two adjacent data words with one another. A counter 5D connected downstream of the logic circuit 5C determines the number of different data bits. A comparator 5E compares the number of different data bits of the two adjacent data words with half the number n of data bits within a data word $DW_i$. If the number of different data bits is greater than half the number of data bits within a data word $DW_i$, the comparator 5E sets an internal data bit inversion flag $DBI_i$ and outputs it to the internal bus 16 via an output line 15-$i$. In one preferred embodiment, the internal data bit inversion flag is set to logic high when the number of different data bits is more than half the number of data bits within a data word.

In the first embodiment of the decoder 5-$i$ shown in FIG. 8, the decoder 5-$i$ contains an integrated correction unit 5F. The correction unit 5F is formed either by a logic circuit or by a memory. If the correction unit 5F is formed by a logic circuit, it corrects the inversion flag $DBI_i$ produced, which is generated by the comparator 5E, on the basis of those inversion flags which are produced by the comparators in all the other m-1 decoders 5-$i$. The correction unit 5F receives the inversion flags produced by the other decoders 5-$i$ via the internal bus 16. On the basis of the received inversion flags of the remaining decoders and the internal inversion flag generated by the comparator 5E, the correction unit 5F generates a corrected inversion flag $DBI_{CORR}$ which is output to the parallel-to-serial converter 14 via an output line 17-$i$, as illustrated in FIG. 7. The corrected inversion flag $DBI_{CORR}$ also actuates a multiplexer 5G integrated in the decoder 5-$i$. The data word $DW_i$ buffered in the register 5A is applied to a first input of the multiplexer via an inversion unit 5H or to a second input of the multiplexer 5G directly. The corrected inversion flag $DBI_{CORR}$, which is produced by the correction unit 5F, actuates the multiplexer 5G, so that the output lines 13-$i$ are used to output the data word $DW_i$ buffered in the register 5A either unchanged or in an inverted fashion. In one preferred embodiment, if the corrected inversion flag $DBI_{CORR}$ is logic high, the data word $DW_i$ buffered in the register 5A is output in inverted form.

Figure 9:
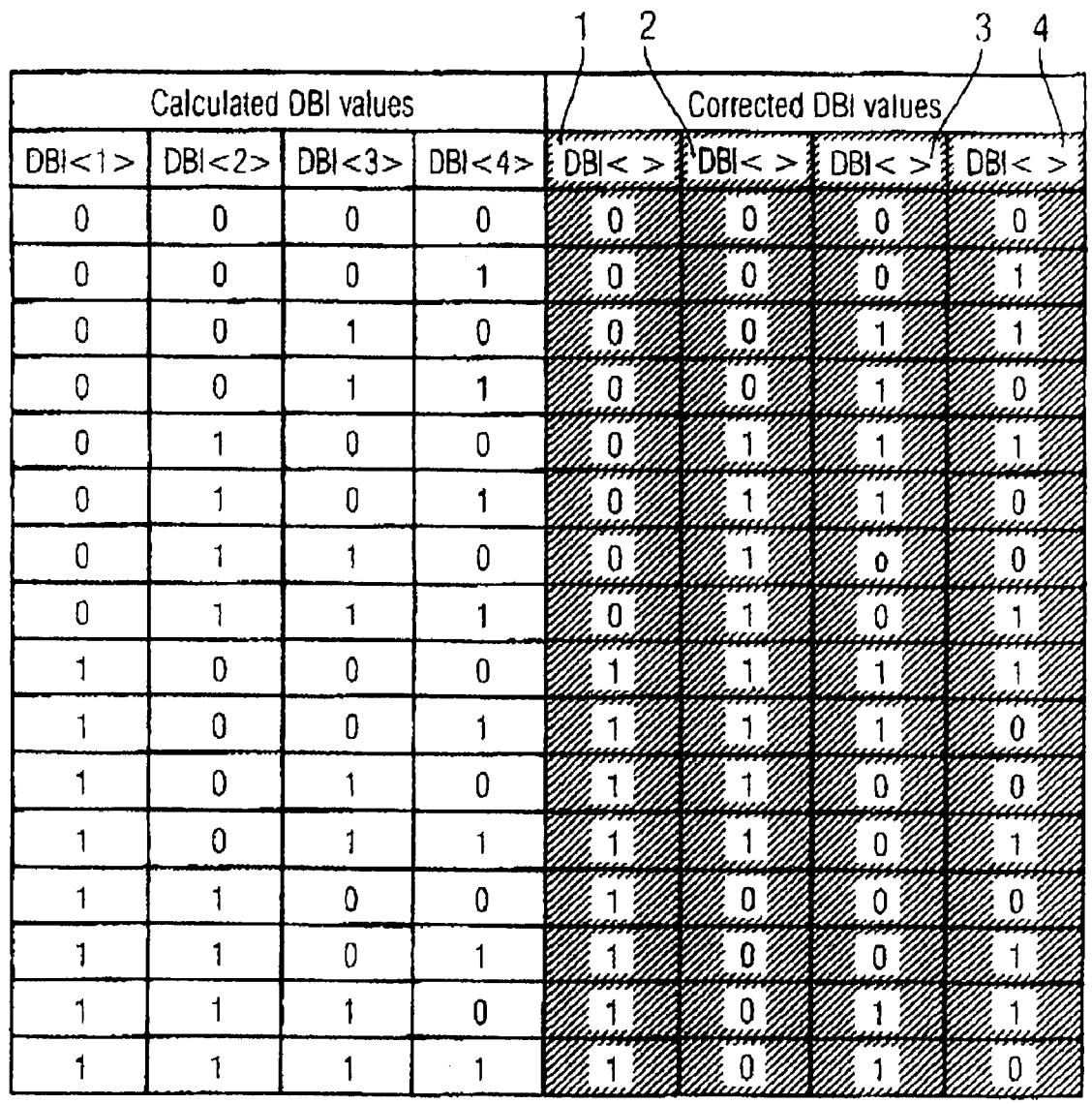
FIG. 9 is a table of the data bit inversion flags stored within a correction circuit of the circuit unit of FIG. 7.

In one alternative embodiment, the correction unit 5F within the decoder 5-$i$ is formed by a memory in which a table is stored. FIG. 9 shows an example of such a correction table within the correction unit 5F for a decoder unit 5 containing m=4 decoders 5-$i$. The four parallel-connected decoders 5-$i$ within the decoder unit 5 produce four DBI values, which are subjected to recorrection. For four DBI values, there are 16 combination possibilities from which 16 corrected combinations are derived. In the example shown in FIG. 9, each correction unit 5F on all the decoder units. 5-$i$ receives the calculated DBI flags via the internal bus 16, i.e. the first four columns of the table in FIG. 9 form the input data for the correction unit 5F. The correction unit 5F in the first decoder unit 5-1 outputs the fifth column of the table as a corrected data bit inversion flag via the associated output line 17-1. The second correction unit 5F within the second decoder unit 5-2 outputs the sixth column as a corrected inversion flag $DBI_{CORR2}$, etc. The correction table shown in FIG. 9 is formed on the basis of the 16 combination possibilities specified in the four first columns. If the first four columns of the correction table are read in a row-wise fashion, the last four columns of the correction table are obtained by virtue of the procedure that as soon as a data bit inversion flag assumes a logic high value (1) the subsequent data bit inversion flags within this row as far as the next logic high value (1) are inverted and the remaining data bit inversion flags within the row are left, until the next logic 1 appears in the row.

Figure 10:
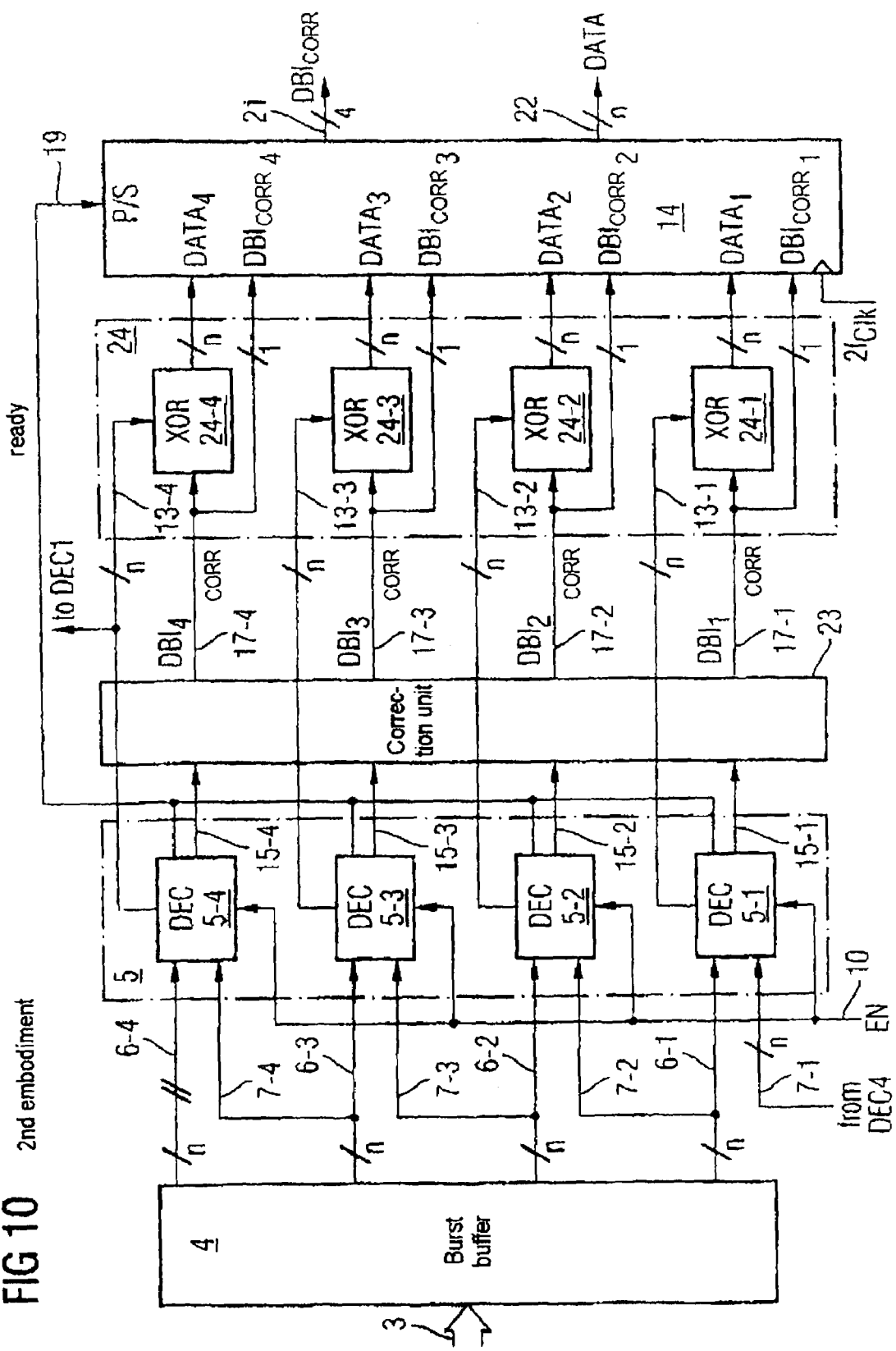
FIG. 10 is a second exemplary embodiment of an inventive circuit unit for data bit inversion.

FIG. 10 shows a further alternative embodiment of the circuit unit 1 according to the invention for data bit inversion of a data burst which has been read from a memory module. In the embodiment illustrated in FIG. 10, the correction unit is not integrated in the decoder unit 5, but rather forms a separate unit. In this embodiment, a correction unit 23 is connected downstream of the decoder unit 5. The inversion unit also forms a separate unit 24 in this embodiment. The inversion flags produced by the decoders of the decoder unit 5 are fed to the correction unit 23 via data lines 15-$i$.

Figure 11:
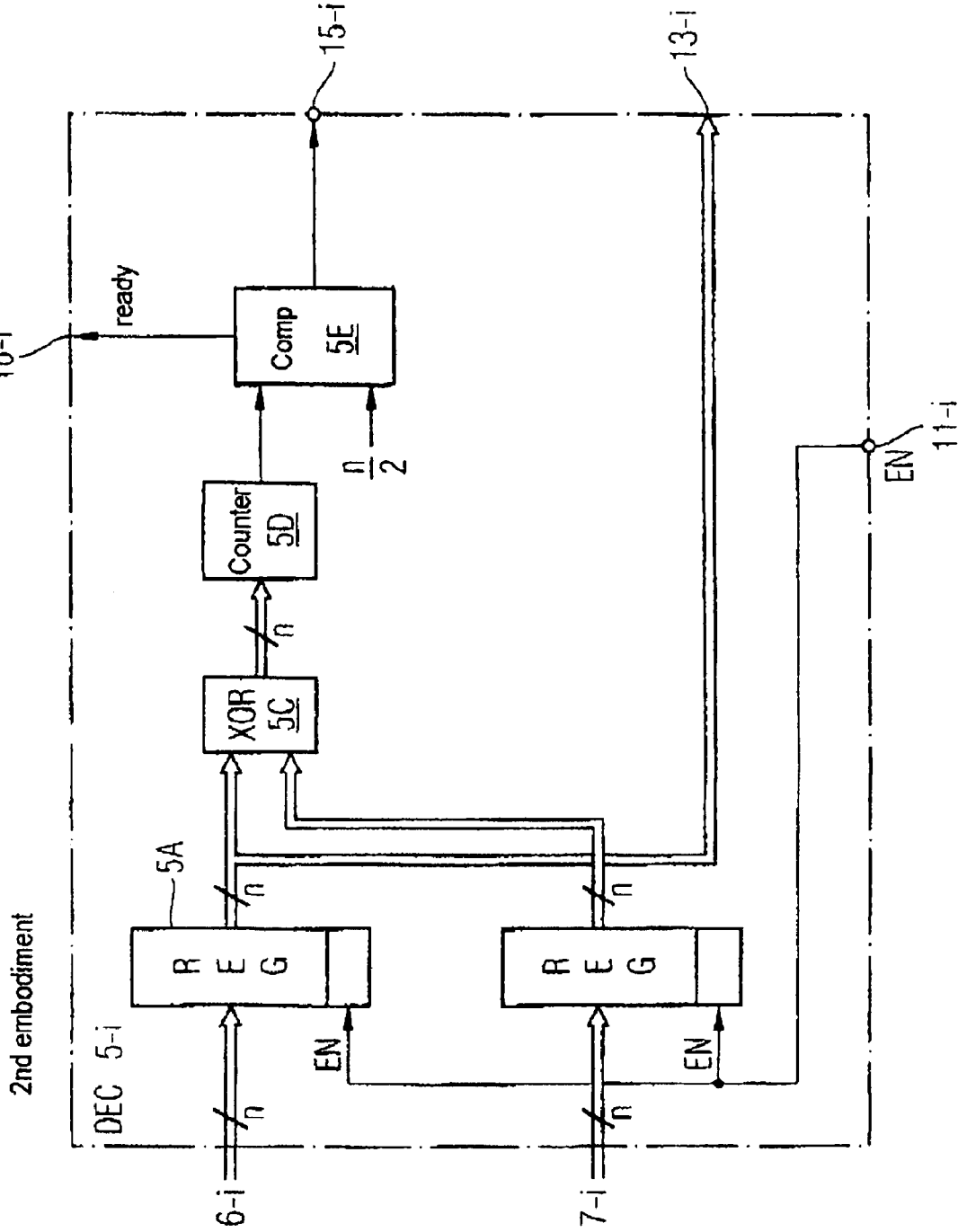
FIG. 11 is a block diagram of a decoder within the circuit unit of FIG. 10.

FIG. 11 shows the circuit design of a decoder 5-$i$ within the decoder unit 5 in the inventive circuit unit 1 based on the embodiment shown in FIG. 10. The data word $DW_i$ buffered by the decoder 5-$i$ is output via data lines 13-$i$ to an XOR logic circuit 24-$i$ within the inversion unit 24 and, on the basis of the corrected data bit inversion flags produced by the correction unit 23, is output by the parallel-to-serial converter 14 in inverted or uninverted fashion.

Figure 12:
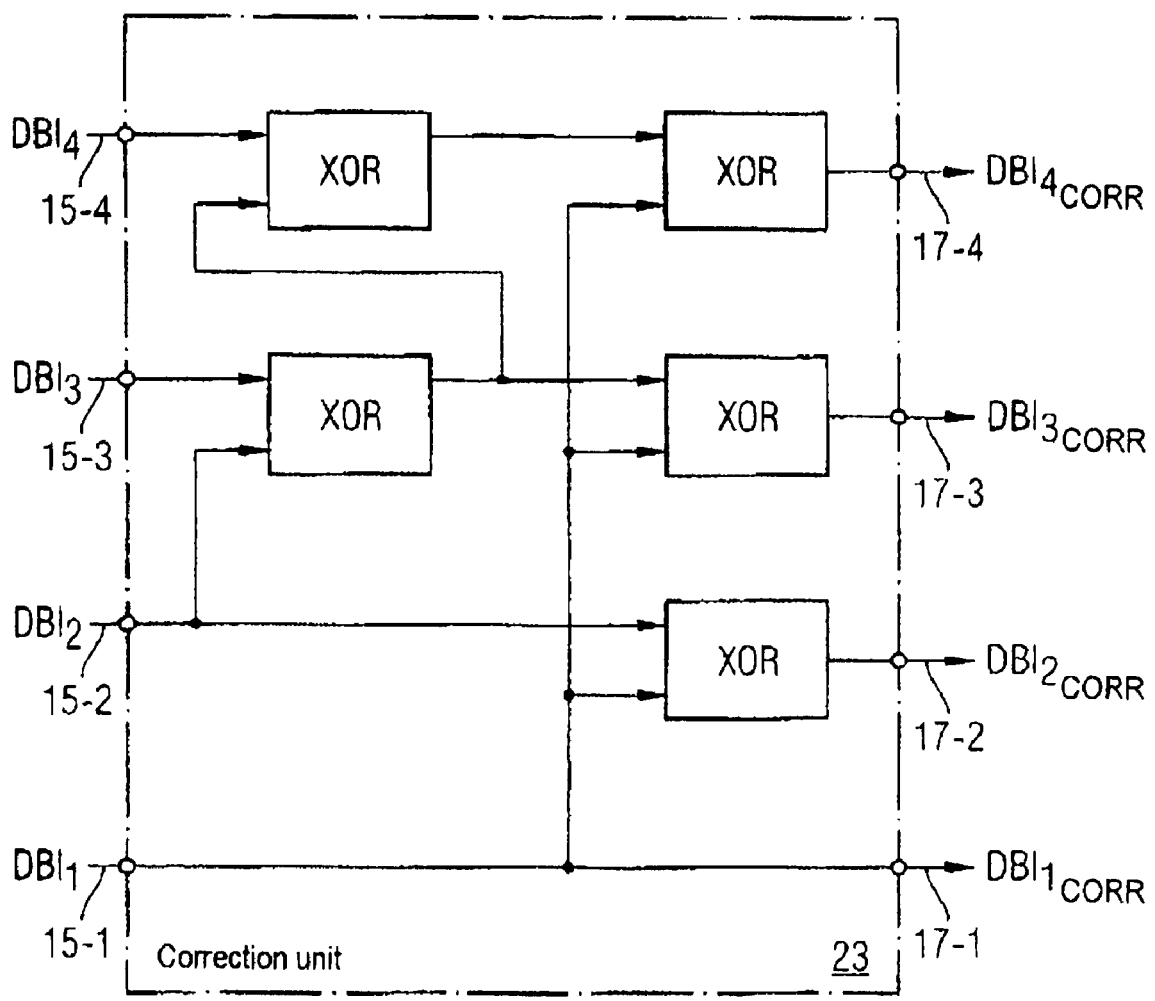
FIG. 12 is a block diagram of a correction of the circuit unit of FIG. 10.

FIG. 12 shows a circuit design for the correction unit 23 for a data burst comprising m=4 data words.

Figure 13A:
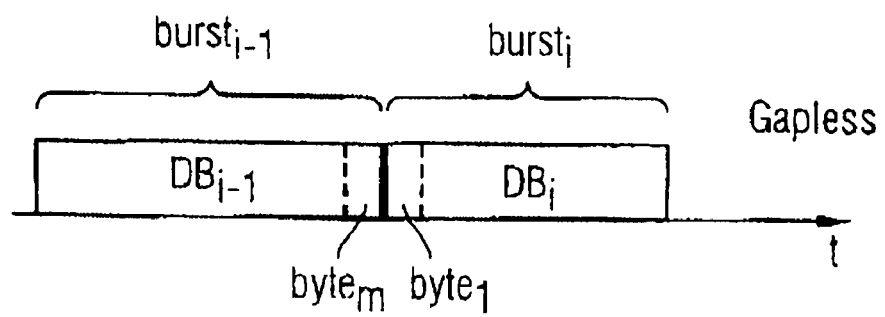
FIG. 13 is a diagram to explain a gap between two data bursts for explaining the mode of operation of a preferred embodiment of the circuit unit according to the invention.
Figure 13B:
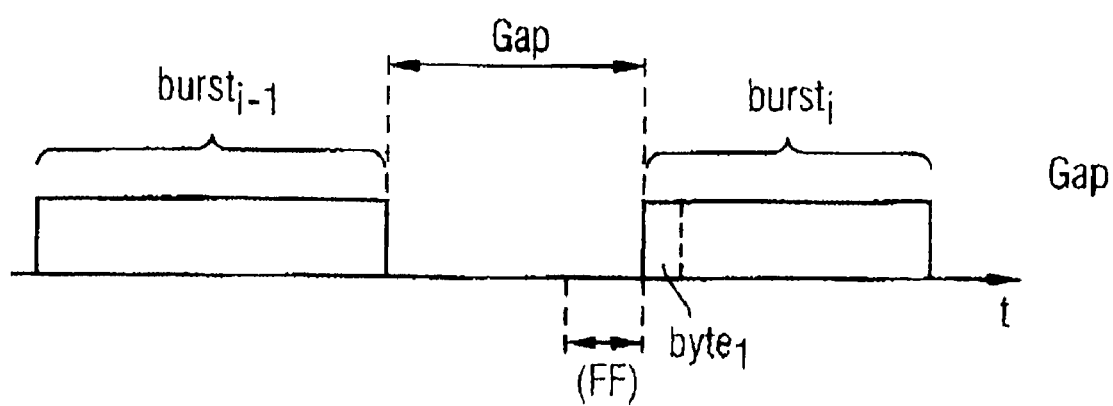

FIG. 13 shows the transfer of data bursts in various modes of operation. In the mode of operation illustrated in FIG. 13A, the data bursts DB are transferred in gapless fashion, that is to say there is no data gap between two data bursts. Accordingly, the last data word of the preceding data burst $DB_{i-1}$ can be used as reference data value for the first data word in the next data burst $DB_i$ in this mode of operation. In an alternative mode of operation, in which a data gap occurs, the data bits on the data bus are logic high during a prescribed time which specifies the minimum interval of time between read commands (RD). These data bits set to logic high can be used as reference data value (FF) for the data bit inversion, as can be seen in FIG. 13B. During this time, all the data lines are in a defined data state, that is to say all the data lines are pulled to logic high by means of active termination pull-up resistors. Whereas the last data word of the previous data burst $DB_{i-1}$ is used as reference data value in the gapless mode of operation, the operating situation in which a data gap occurs between the data bursts involves a reference data word being used in which all the data are set to logic high, that is to say in the gap mode of operation the reference data word is formed by the value FF.

In a preferred embodiment of the circuit unit 1 according to the invention, the decoders 5-i within the decoder unit 5 are extended such that they cover both modes of operation. To this end, each decoder 5-i is provided with a GAP detection unit 25 which detects whether or not there is a data gap between two data bursts DB. As illustrated in FIG. 14, the GAP detection unit 25 produces a control signal for a multiplexer 26 on the basis of whether or not the reference data word forms part of a data gap between two bursts DB. As soon as a command decoder 26 within the memory module detects a read command (RD), it outputs a trigger signal via a line 27 to the SET input of a flip-flop 28 within the GAP detection unit 25 and at the same time starts a counter 29. The counter 29 counts out the length N of a data burst DB, which length is programmed in a register in the memory module. As soon as the data length N of the data burst has been reached, the counter 29 sends a reset pulse to the flip-flop 28. In the case of continuous data access, in which no data gap occurs, the reset pulse produced is suppressed by renewed reading on a gate 30 within the GAP detection unit 25, so that the control signal (Read Gapless) produced on the control line 31 remains set. When the control signal of the control line 31 is set, that is to say for the gapless operating situation, the reference data word used for the decoders 5-i is the buffered data burst's adjacent data word, which is present at the first signal input 32 of the multiplexer, and it is switched through to the decoder 5-i via data lines 33 as reference data word. If the detection unit 25 conversely detects that a gap has occurred between the two data bursts, as illustrated in FIG. 13B, the multiplexer 26 is changed over to its second signal input 34, so that the decoder 5-i receives a predetermined reference data word, preferably the reference data word FF.

In the case of continuous data access (Gapless), the reference data value is the last data word which was driven on the bus. In the case of access operations with intervals, the reference data value is formed by a predetermined data word, for example FF. In the case of the GDDR3 and GDDR4 interfaces with the appropriate standard, the data bus is terminated at high level in the idle state when data gaps occur. For the data bit inversion, the result of this is that at the start of the first assessment the reference value is set to high for all data bits.

Figure 15:
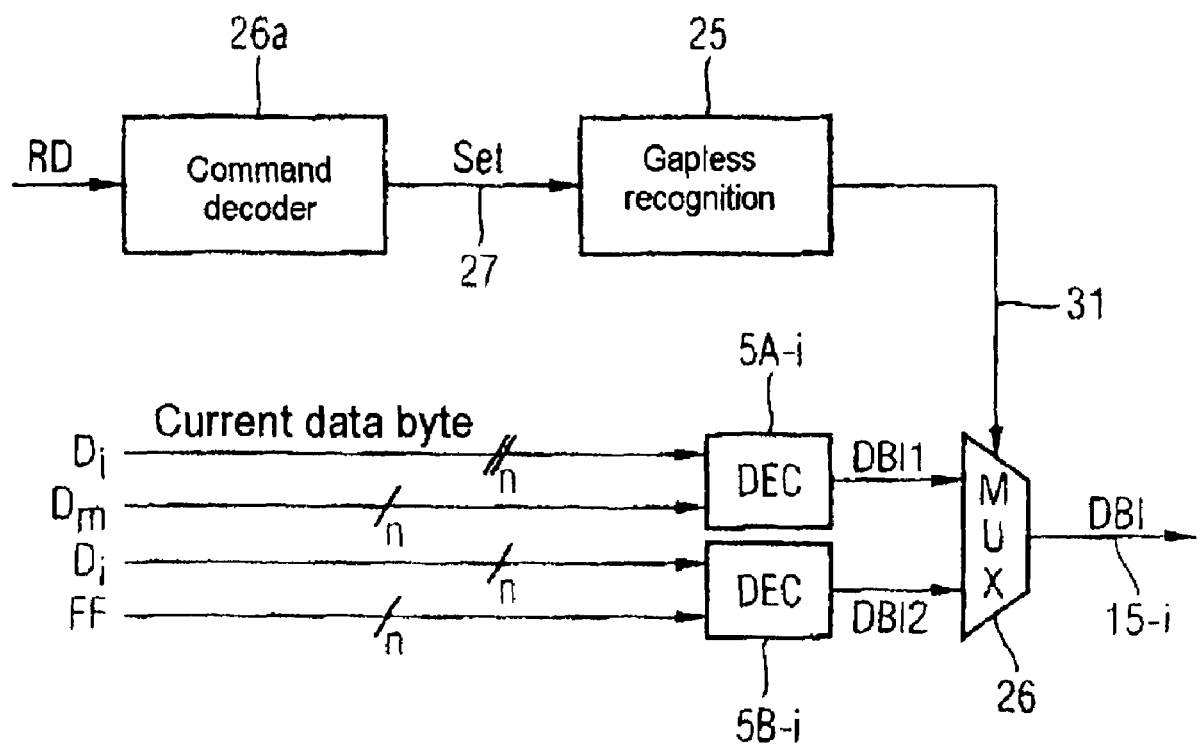
FIG. 15 is a preferred embodiment of the gap detection unit used within the circuit unit according to the invention.

FIG. 15 shows a further improvement of the circuit arrangement illustrated in FIG. 14. In the case of the embodiment illustrated in FIG. 15, each decoder 5-i of the decoder unit 5 is replaced by two parallel-connected decoders 5A-i, 5B-i, which are connected upstream of the multiplexer 26. In the case of the embodiment illustrated in FIG. 14, the gap detection and the subsequent decoding take place serially in succession, so that this increases the waiting time or access time in line with the duration of the detection operation. In the case of the preferred embodiment illustrated in FIG. 15, the data bit inversion flag is produced in parallel for both operating situations, that is to say by the first decoder 5A-i for the case of gapless data bursts and by the decoder 5B-i for the case in which a data gap occurs between two data bursts. In parallel with this, the gapless detection circuit 25 detects which of the two modes of operation is present. While the data bit inversion flags are produced by the two decoders, the gapless detection unit 25 detects which of the two operating situations is present, so that the waiting time gives the maximum of the two processing times of the gapless unit 25 and of the decoder units 5A, 5B.

$$\Delta T = \max(T_{DEC}, T_{GAPDEC}) < T_{GAPDEC} + T_{DEC}$$

The provision of two parallel decoders 5A, 5B can further minimize the waiting time and/or memory access time.

Although modifications and changes may be suggested by those skilled in the art, it is the intention of the inventor to embody within the patent warranted heron all changes and modifications as reasonably and properly come within the scope of his contribution to the art.

I claim as my invention:

1. An electric circuit for inverting a data bit of a data burst read out from a memory module, comprising:
   a buffer for buffering a data burst being comprised of at least two data words, each comprising a specific number of data bits;
   a decoder device comprised of at least two parallel-connected decoders, each comparing bitwise and simultaneously an associated present data word of said data words buffered in said buffer with a reference data word and generating an inversion flag, if the number of different data bits of said data word present at said decoder and said reference data word exceeds half said specific number; said reference data word being a data word of said data words buffered in said buffer and neighbouring said present data word;
   a correction device for generating a corrected inversion flag for a specific decoder of said decoders by inverting or not inverting said inversion flag of said specific decoder dependent on said inversion flag generated by said specific decoder and said inversion flags generated by the remaining decoders of said decoders; and
   an inversion device comprised of a plurality of inverters, each inverting or not inverting said present word of an associated of said decoders dependent on said corrected inversion flag of said associated decoder.

2. The electric circuit of claim 1, comprising a parallel-to-serial converter for converting said data words output by said inversion device and said associated corrected inversion flags in a parallel-to-serial fashion in order to output the result of said conversion from said memory module as a further data burst.

3. The electric circuit of claim 1, wherein each of said inverters comprise a plurality of XOR gates.

4. The electric circuit of claim 1, wherein each of said decoders comprises a logic circuit comparing said first and second data words in a bitwise fashion.

5. The electric circuit of claim 4, wherein said logic circuit comprises a plurality of XOR gates.

6. The electric circuit of claim 1, wherein each of said decoders comprises a counter determining the number of said different data bits between said present data word and said reference data word.

7. The electric circuit of claim 6, wherein each of said decoders comprises a comparator comparing said number determined by said counter with half said specific number.

8. The electric circuit of claim 7, wherein said comparator generates a logically high inversion flag when said number determined by said counter exceed half said specific number.

9. The electric circuit of claim 1, wherein said correction device is a separate electric circuit connected downstream of said decoder device.

10. The electric circuit of claim 1, wherein said correction device is integrated in said decoder device.

11. The electric circuit of claim 10, wherein said integrated correction device comprises of a plurality of correction circuits, each being included in an associated of said decoders.

12. The electric circuit of claim 11, wherein a specific of said correction circuits is formed by a logic circuit correcting said inversion flag generated by said comparator of said decoder associated with said specific correction circuit dependent on said inversion flags generated by the remaining of said comparators in order to generate said corrected inversion flag.

13. The electric circuit of claim 11, wherein a specific of said correction circuits is formed by a memory from which said corrected inversion flag of said decoder associated with said specific correction circuit is read out as a function of said inversion flag generated by said specific comparator and as a function of said inversion flags generated the remaining of said comparators.

14. The electric circuit of claim 12, wherein said corrected inversion flag drives a multiplexer of said decoder which outputs said data word applied to said decoder in a direct or inverted fashion.

15. The electric circuit of claim 1, wherein each of said data bursts comprises four data words.

16. The electric circuit of claim 1, wherein each of said data words comprises 8 bits.

17. The electric circuit of claim 1, wherein each of said decoders is connected to a gap-detection device ascertaining whether a gap exists between two of said data bursts in order to generate a control signal for a multiplexer.

18. The electric circuit of claim 17, wherein, when a gap exists between two of said data bursts, said gap-detection device drives said multiplexer in such a way that a predetermined data word is switched through for the purpose of bitwise comparing it with said present data word, and, when no gap exists between two of said data bursts, the gap-detection device drives said multiplexer in such a way that said reference data word is switched through for the purpose of bitwise comparing it with said present data word.

19. The electric circuit of claim 17, wherein two separate of said decoders are connected downstream of said multiplexer driven by said control signal generated by said gap-detection device; a first decoder of said two separate decoders comparing said present data word with said reference data word in bitwise fashion in order to generate a first inversion flag; a second decoder of said two separate decoders comparing said present data word with a predetermined data word in order to generate a second inversion flag; and said multiplexer switching said first inversion flag or said second inversion flag through to said correction device dependent on said control signal.

* * * * *